United States Patent [19]
Jatko et al.

[11] Patent Number: 4,611,176
[45] Date of Patent: Sep. 9, 1986

[54] PRECISION LINEAR RAMP FUNCTION GENERATOR

[75] Inventors: W. Bruce Jatko, Knoxville; David R. McNeilly, Maryville; Louis H. Thacker, Knoxville, all of Tenn.

[73] Assignee: The United States of America as represented by the Department of Energy, Washington, D.C.

[21] Appl. No.: 636,657

[22] Filed: Aug. 1, 1984

[51] Int. Cl.⁴ .................. H03K 4/10; H03K 4/84
[52] U.S. Cl. .................. 328/184; 328/181; 307/228
[58] Field of Search .............. 307/228; 328/127, 128, 328/181, 184

[56] References Cited

U.S. PATENT DOCUMENTS

| | | | |
|---|---|---|---|
| 3,529,245 | 9/1970 | Single | 328/127 |
| 3,560,864 | 2/1971 | Nihof | 328/127 |
| 3,978,414 | 8/1976 | Bober et al. | 328/127 |
| 4,430,641 | 2/1984 | Baur et al. | 328/128 |

*Primary Examiner*—Stanley D. Miller
*Assistant Examiner*—B. P. Davis
*Attorney, Agent, or Firm*—David E. Breeden; Stephen D. Hamel; Judson R. Hightower

[57] ABSTRACT

A ramp function generator is provided which produces a precise linear ramp function which is repeatable and highly stable. A derivative feedback loop is used to stabilize the output of an integrator in the forward loop and control the ramp rate. The ramp may be started from a selected baseline voltage level and the desired ramp rate is selected by applying an appropriate constant voltage to the input of the integrator.

1 Claim, 1 Drawing Figure

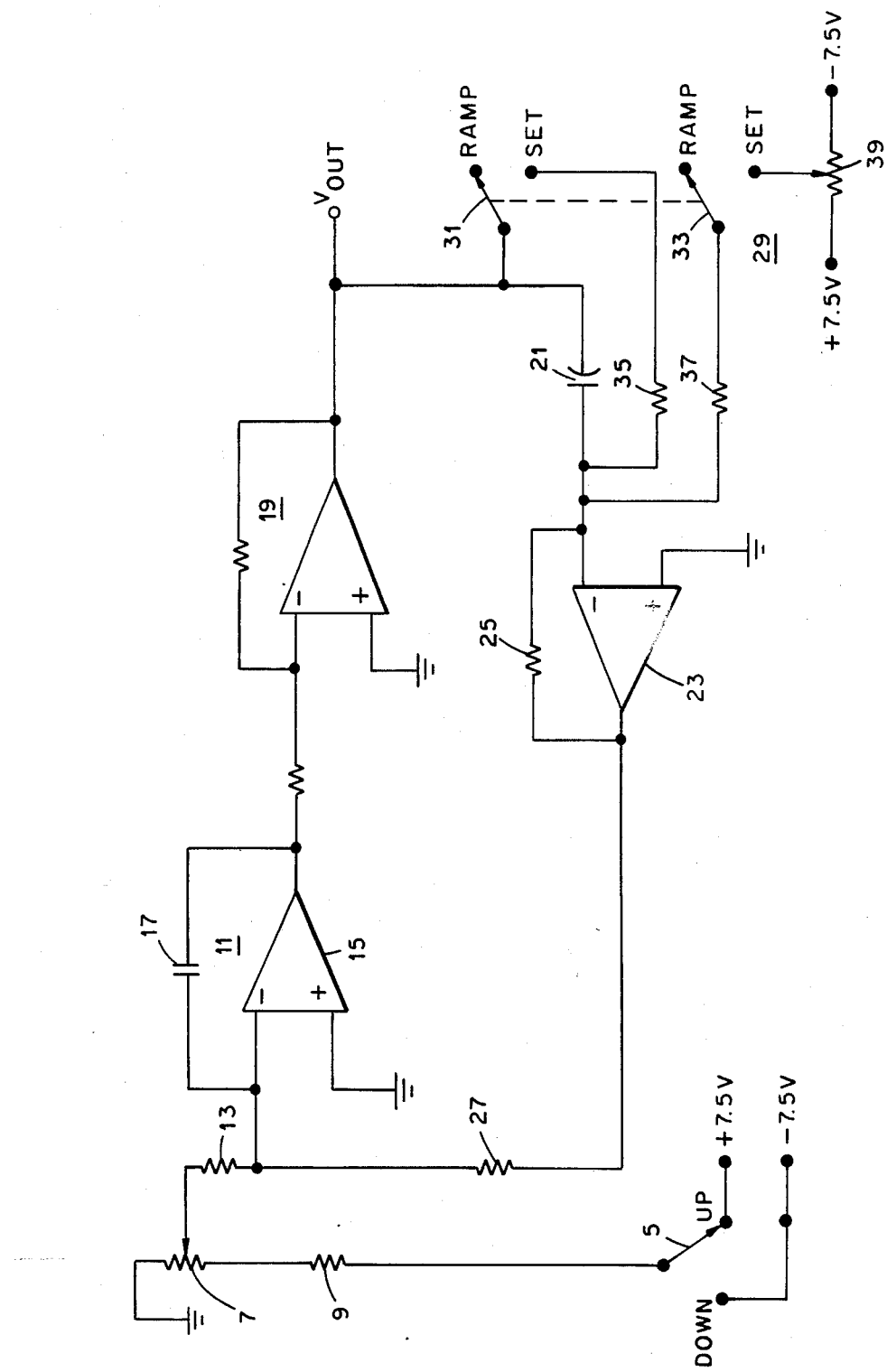

PRECISION LINEAR RAMP FUNCTION GENERATOR

BACKGROUND OF THE INVENTION

This invention, which is a result of a contract with the United States Department of Energy, relates generally to ramp function generators and more specifically to improvements in ramp function generators.

In various precision measuring and testing applications such as a stress testing device, a precision ramp function generator is often needed which has precise linear output. Further, it is often necessary to begin the ramp from an operator-selected bias point (a dc voltage level) and return to exactly the selected voltage level for subsequent tests. It is also required that the ramp begin smoothly from the selected dc set point, i.e., without introducing transients on startup for uniform stress analysis.

In a conventional analog ramp function generator a constant current or voltage is switched onto the input of an integrator which then produces the ramp function at the output. Various proportional feedback loops have been used in the past to attempt to stabilize the integrator output. However, the switching operation introduces transients in the integrator output and the output is subject to drift due to individual component changes and secondary effects.

Thus, there is a need for a simple means of generating a stable ramp function that is free of transients on startup and is stable over a wide range of ramp rates.

SUMMARY OF THE INVENTION

In view of the above need, it is an object of this invention to provide an improved linear ramp function generator which is extremely stable and free of transients on startup.

Further, it is an object of this invention to provide a ramp function generator as in the above object which is capable of generating a ramp function output which may be started from an operator-selected bias point.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects in accordance with the purpose of the present invention, as embodied and broadly described herein, the ramp function generator of this invention may comprise a forward loop integrator which is connected at its input to a constant voltage source and a derivative feedback loop. The feedback loop acts as the ramp rate controller and ensures a stable linear ramp signal output. The ramp signal may be started from an operator-selected bias voltage level by means of a switch-selectable alternate feedback arrangement which forces the output of the integrator to a selected voltage level.

BRIEF DESCRIPTION OF THE DRAWINGS

The accompanying drawing, which is incorporated in and forms a part of the specification, and together with the description, serves to explain the principles of the invention, is a schematic circuit diagram of a ramp function generator according to the present invention.

DETAILED DESCRIPTION OF THE PREFERRED EMBODIMENT

Referring now to the drawing, an operator selectable constant voltage source is provided which includes a two-position selector switch 5 for selecting either a positive or negative ramp output, and a voltage divider consisting of a potentiometer 7 and a series resistor 9. A positive dc voltage source (+7.5 V) is connected to one terminal of the switch 5 and a negative dc voltage source (−7.5 V) is connected to the other terminal. For a positive going ramp the switch is placed in the position as shown to apply the positive source voltage across the voltage divider. The adjustable arm of the potentiometer 7 is connected to the input of an integrator 11 through a resistor 13. The integrator 11 includes an operational amplifier 15 having the noninverting (+) input connected to ground and the inverting input (−) connected as the input. A capacitor 17 is connected between the output of amplifier 15 and the inverting input thereof which performs the integrating function.

The output of integrator 11 is connected to an inverting buffer amplifier 19 which inverts the output signal back to the original input polarity for a corresponding polarity ramp output ($V_{out}$). The output of amplifier 19 is fed back to the input of the integrator 11 through a differentiator composed of a series capacitor 21, operational amplifier 23 and a feedback resistor 25. The capacitor 21 is connected between the output of buffer amplifier 19 and the inverting input of amplifier 23. The output of amplifier 23 is connected through a resistor 27 to the input of the integrator 11. The differentiator controls the selected ramp rate as will be explained hereinbelow. The derivative signal is applied in a negative feedback arrangement through the inversion of the signal by the operational amplifier 23 to compensate any change in the output ramp rate to provide a smooth linear ramp signal at the output ($V_{out}$).

In order to selectively preset the baseline voltage from which the ramp function starts, a bias selecting circuit 29 is provided which forces the integrator to ramp to a selected level equal to the selected bias level and holds the output at this level until released to start the selected ramp rate. The circuit includes two ganged selector switches 31 and 33. The selector arm of switch 31 is connected to the output of amplifier 19; and, when switched to the set position, connects a shunting resistor 35 between the output of amplifier 19 and the input of amplifier 23, shunting the differentiating capacitor 21 in the feedback loop. This action converts the feedback circuit to a linear amplifier which compares the output voltage $V_{out}$ with a setpoint voltage applied to the input of amplifier 23 through a resistor 37 connected between the selector arm of switch 33 and the inverting input of amplifier 23. The setpoint voltage is provided at the set terminal of switch 33 by connecting this terminal to the adjustable arm of a potentiometer 39 which is connected at one end to a +7.5 V source and at the other end to a −7.5 V source.

In the set mode, the setpoint voltage is selected by adjusting the potentiometer 39 to give a desired baseline output voltage. The output voltage ($V_{out}$) is summed with the setpoint voltage at the inverting input of amplifier 23. An error voltage signal is generated at the output of amplifier 23 which is fed to the input of integrator 11. This error signal causes the integrator output to hold at the desired setpoint or baseline voltage amplitude. Thus, the output voltage ($V_{out}$) is held at the setpoint level. If $V_{out}$ is different from the setpoint voltage when the set ramp switches 31 and 33 are changed to the setpoint position, the error voltage will force the integrator to change so that $V_{out}$ ramps toward the setpoint voltage until a zero volt difference condition is satisfied at the input of amplifier 23. The output voltage $V_{out}$ will hold at the setpoint until the ramp function is selected.

When the set ramp switches are changed to the ramp position, the shunt is removed from the feedback loop-series capacitor 21 and the setpoint voltage is removed from the input of amplifier 23. This allows the output to ramp from the setpoint baseline at a rate selected by the voltage applied to the input of the integrator from the ramp rate potentiometer 7. This switchable feedback arrangement allows a baseline voltage to be generated which will hold at the desired setpoint voltage and will make a smooth transition to a desired ramp rate. The output will ramp up or down from the baseline depending on the polarity of the integrator input voltage selected by the ramp direction switch 5. The derivative feedback acts to hold the output rate of change constant. If the rate increases, the derivative signal at the output of amplifier 23 increases toward the opposite polarity of the voltage applied to the input of the integrator 11 thereby forcing the rate back to the selected value and vice versa if the ramp rate decreases. This forces the ramp output to be linear, and since dv/dt is held constant, the ramps are highly repeatable and stable.

Thus, it will be seen that a ramp generator has been provided which generates an extremely linear, stable and reproducible ramp function that is free of transients on startup.

Although the invention has been described by means of a specific illustrated embodiment, the description is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is inteded that the scope of the invention be defined by the claims appended hereto.

We claim:
1. A ramp function generator, comprising:
a voltage integrator having an input and an output;
a constant voltage generating means for selectably generating and applying either a positive or negative constant voltage to the input of said integrator corresponding to a desired positive or negative ramp function at the output of said integrator;
a differentiator feedback circuit connected between the output and input of said integrator for generating and applying a feedback voltage in a negative feedback arrangement corresponding to the derivative of the output ramp rate of said integrator to alter the input voltage to said integrator in a manner to force a linear output at the selected ramp rate, said differentiator feedback circuit comprising an operational amplifier having an input and an output connected to the input of said integrator, a series capacitor connected between the output of said integrator and the input of said operational amplifier and a feedback resistor connected between the output and input of said operational amplifier; and
a selector switch comprising first and second ganged switches, a variable setpoint voltage source, and first and second summing resistors each having one end connected to the input of said operational amplifier, said first switch connected between the output of said integrator and the other end of said first summing resistor and said second switch connected between said setpoint voltage source and the other end of said second summing resistor so that when said swtiches are switched to the closed position corresponding to a set position of said selector switch the output voltage of said integrator is summed with a selected setpoint voltage from said setpoint voltage source at the input of said operational amplifier to generate an error voltage signal at the output of said operational ampifier which alters the input voltage to said integrator sufficient to force the output voltage of said integrator to hold at a baseline voltage level corresponding to said setpoint voltage level and when said switches are switched to the open position corresponding to a ramp position of said selector switch said ramp function is generated beginning from said baseline voltage level.

* * * * *